(12) United States Patent
Kim et al.

(10) Patent No.: US 8,524,616 B2
(45) Date of Patent: Sep. 3, 2013

(54) METHOD OF NONSTOICHIOMETRIC CVD DIELECTRIC FILM SURFACE PASSIVATION FOR FILM ROUGHNESS CONTROL

(75) Inventors: Lance Kim, Camas, WA (US); Kwanghoon Kim, Happy Valley, OR (US)

(73) Assignee: Microchip Technology Incorporated, Chandler, AZ (US)

( * ) Notice: Subject to any disclaimer, the term of this patent is extended or adjusted under 35 U.S.C. 154(b) by 562 days.

(21) Appl. No.: 12/577,486

(22) Filed: Oct. 12, 2009

(65) Prior Publication Data

US 2010/0120261 A1 May 13, 2010

Related U.S. Application Data

(60) Provisional application No. 61/113,805, filed on Nov. 12, 2008.

(51) Int. Cl.
*H01L 21/469* (2006.01)

(52) U.S. Cl.
USPC .......................... 438/784; 438/778

(58) Field of Classification Search
USPC .................................. 438/778, 783, 784
See application file for complete search history.

(56) References Cited

U.S. PATENT DOCUMENTS

| | | | |
|---|---|---|---|
| 5,512,513 A | 4/1996 | Machida et al. | 437/195 |
| 5,840,600 A | 11/1998 | Yamazaki et al. | 438/151 |
| 5,946,542 A * | 8/1999 | Iyer | 438/7 |
| 6,255,230 B1 * | 7/2001 | Ikakura et al. | 438/765 |
| 6,372,670 B1 * | 4/2002 | Maeda | 438/787 |
| 6,524,972 B1 * | 2/2003 | Maeda | 438/778 |
| 6,849,505 B2 * | 2/2005 | Lee et al. | 438/261 |
| 7,001,855 B2 * | 2/2006 | Ohmi et al. | 438/792 |
| 2001/0012699 A1 * | 8/2001 | Maeda | 438/789 |
| 2001/0017402 A1 * | 8/2001 | Usami | 257/642 |
| 2001/0029109 A1 * | 10/2001 | Maeda et al. | 438/778 |
| 2003/0124873 A1 * | 7/2003 | Xing et al. | 438/770 |
| 2003/0148629 A1 * | 8/2003 | Ohmi et al. | 438/778 |
| 2005/0124109 A1 | 6/2005 | Quevedo-Lopez et al. | 438/240 |

(Continued)

OTHER PUBLICATIONS

Hu, Y.Z., et al., "Effects of Hydrogen Surface Pretreatment of Silicon Dioxide on the Nucleation and Surface Roughness of Polycrystalline Silicon Films Prepared by Rapid Thermal Chemical Vapor Deposition", Applied Physics Letters, American Institute of Physics, vol. 69, No. 4, pp. 485-487, Jul. 22, 1996.

(Continued)

*Primary Examiner* — Kyoung Lee
*Assistant Examiner* — Grant Withers
(74) *Attorney, Agent, or Firm* — King & Spalding L.L.P.

(57) ABSTRACT

A method is provided for reducing film surface roughness in Chemical Vapor Deposition (CVD) of dielectric films. The method may include removing dangling bonds from a film surface of a CVD dielectric film by a reactant. For reducing a surface roughness of a dielectric film, a further method may passivate a nonstoichiometric film surface of the dielectric film, or of a previous dielectric film, or of the dielectric film and of a previous dielectric film, by a reactant gas in the vapor environment. The dielectric film may include at least one out of the following group: ultraviolet light transparent Silicon Nitride (UVSIN), Silicon Rich Oxide (SRO), Silicon Dioxide ($SiO_2$), Silicon Nitride ($Si_3N_4$), Phosphosilicate Glass (PSG), or Silicon Oxynitride (SiON) The reactant gas may include at least one out of the following group: Ammonia ($NH_3$), Hydrogen ($H_2$), Nitrous Oxide ($N_2O$), or Oxygen ($O_2$).

15 Claims, 6 Drawing Sheets

(56) References Cited

U.S. PATENT DOCUMENTS

| | | |
|---|---|---|
| 2006/0121744 A1* | 6/2006 | Quevedo-Lopez et al. .... 438/785 |
| 2006/0205155 A1* | 9/2006 | Makabe et al. ............... 438/257 |
| 2006/0205230 A1 | 9/2006 | Pomarede et al. ............ 438/769 |
| 2008/0305647 A1* | 12/2008 | Matsushita et al. ........... 438/791 |
| 2008/0318442 A1* | 12/2008 | Ogawa et al. ................. 438/785 |
| 2010/0032838 A1* | 2/2010 | Kikuchi et al. ............... 257/751 |
| 2010/0120261 A1* | 5/2010 | Kim et al. ..................... 438/778 |

OTHER PUBLICATIONS

International PCT Search Report and Written Opinion, PCT/US2009/064007, 14 pages, Mailed Feb. 4, 2010.

European Office Action, European Patent Application No. 09 756 206.0-1235, 5 pages, Oct. 19, 2012.

* cited by examiner

METHOD OF NONSTOICHIOMETRIC CVD DIELECTRIC FILM SURFACE PASSIVATION FOR FILM ROUGHNESS CONTROL

CROSS-REFERENCE TO RELATED APPLICATIONS

This application claims the benefit of U.S. Provisional Application No. 61/113,805 filed on Nov. 12, 2008, entitled "Method Of Nonstoichiometric CVD Dielectric Film Surface Passivation For Film Roughness Control", which is incorporated herein in its entirety.

TECHNICAL FIELD

The technical field of the present invention relates to reduction of film roughness and defect. More particularly, the present invention relates to a method for eliminating film roughness for a Chemical Vapor Deposition (CVD) film, such as for example a Plasma Enhanced Chemical Vapor Deposition (PECVD) film for semiconductor or integrated circuits (ICs or chips) fabrication.

BACKGROUND

In recent years, attention has been given to depositing layers, especially in the field of semiconductor or IC fabrication. Deposition is a step in IC manufacturing. During deposition, a layer of, for example, either electrically insulating (dielectric) or electrically conductive material is deposited or grown on a silicon wafer. One type of deposition is Chemical Vapor Deposition (CVD). CVD is used to deposit films that function, for example, as dielectrics (insulators), metals (conductors), or semiconductors (partial conductors) on a substrate. During the CVD process, precursor gases that contain atoms of the material to be deposited may react on the substrate surface, forming a thin film of solid material.

One form of CVD is Plasma Enhanced Chemical Vapor Deposition (PECVD). PECVD is used as a deposition method for semiconductor fabrication for mainly depositing dielectric thin films from a gas phase (vapor) to a solid state on some substrates. There are some chemical reactions involved in the process which occur after creation of a plasma of the reacting precursor gases.

As IC technology is getting advanced, in CVD and PECVD there exists a need to provide films with controlled surface roughness. A smooth surface is desired because it may allow for a good result in a photolithography process. There also exists a need to provide films that are defect-free, and to provide films that adhere to the host substrate. Furthermore, there exists a need to provide films that are uniform in thickness, as well as in chemical, electrical, and mechanical properties.

It may further be desirable to eliminate, or at least to reduce, film roughness at Premetal Dielectric (PMD), Intermetal Dielectric (IMD) and Passivation modules in a substrate process flow. It may further be desirable to improve defect monitoring, such as for example in-line substrate defect monitoring provided for by KLA-Tencor Corporation. It may further be desirable to provide for a smooth surface of dielectric layers.

SUMMARY

According to one embodiment a method for reducing film surface roughness in Chemical Vapor Deposition (CVD) of dielectric films is provided. One step of the method is removing dangling bonds from a film surface of a CVD dielectric film by passivating the film surface with a reactant.

According to one embodiment a system may include means for depositing a dielectric film by Chemical Vapor Deposition (CVD) on a wafer and means for introducing a reactant gas in-situ with a dielectric film deposition sequence. The means for introducing a reactant gas may be operable to remove dangling bonds from a film surface of a dielectric film deposited by CVD.

According to a further embodiment a method for reducing film surface roughness in Chemical Vapor Deposition (CVD) of dielectric films is provided. The reduction of a surface roughness of a dielectric film is done by passivating a nonstoichiometric film surface of the dielectric film, or of a previous dielectric film, or of the dielectric film and of a previous dielectric film, by a reactant gas in the vapor environment.

According to further embodiments, the dangling bond removal step may reduce a surface roughness of a subsequent film by removing dangling bonds from the film surface of a previous dielectric film. The dangling bond removal step can be done before or after, or before and after, a main film deposition step. Preferably, the dangling bond removal step can be done in-situ with a dielectric film deposition sequence.

In further embodiments, a subsequent dielectric film may be deposited, and may include at least one out of the following group: a premetal dielectric (PMD) film, an intermetal dielectric (IMD) film, or a passivation film. The dielectric film may include at least one out of the following group: ultraviolet light transparent Silicon Nitride (UVSIN), Silicon Rich Oxide (SRO), Silicon Dioxide ($SiO_2$), Silicon Nitride ($Si_3N_4$), Phosphosilicate Glass (PSG), or Silicon Oxynitride (SiON). The reactant gas may include at least one out of the following group: Ammonia ($NH_3$), Hydrogen ($H_2$), Nitrous Oxide ($N_2O$), or Oxygen ($O_2$).

There may be several CVD methods that are suitable for the above mentioned method and system. For example, the CVD method may be one out of the following group: Thermal CVD (TCVD), Atmospheric pressure CVD (APCVD), Low-pressure CVD (LPCVD), Ultrahigh vacuum CVD (UHVCVD), Aerosol assisted CVD (AACVD), Direct liquid injection CVD (DLICVD), Microwave plasma-assisted CVD (MPCVD), Plasma Enhanced CVD (PECVD), Remote plasma-enhanced CVD (RPECVD), Atomic layer CVD (ALCVD), Hot wire CVD (HWCVD), Catalytic CVD (Cat-CVD), hot filament CVD (HFCVD), Metalorganic chemical vapor deposition (MOCVD), Hybrid Physical-Chemical Vapor Deposition (HPCVD), Rapid thermal CVD (RTCVD), or Vapor phase epitaxy (VPE).

At least one of the embodiments may provide films with controlled surface roughness. At least one of the embodiments may provide films that are pinhole-free, and films that adhere to a host substrate. At least one of the embodiments may provide films that are uniform in thickness, as well as in chemical, electrical, and mechanical properties.

At least one of the embodiments may eliminate, or at least reduce, film roughness at Premetal Dielectric (PMD), Intermetal Dielectric (IMD) and Passivation modules in a substrate process flow. Such a reduction may enable a photolithography process to become more marginal.

At least one of the embodiments may improve defect monitoring, such as for example in-line substrate defect monitoring by KLA-Tencor. Such a control of film roughness may render KLA defect detection much more sensitive and precise to a smaller size of defect detection limits.

At least one of the embodiments may provide for a smooth surface of dielectric layers. Such smooth surfaces may provide better real-estate for Front-End IC devices with reliable device characteristics.

Other technical advantages of the present disclosure will be readily apparent to one skilled in the art from the following description and claims. Various embodiments of the present application obtain only a subset of the advantages set forth. No one advantage is critical to the embodiments. Any claimed embodiment may be technically combined with any preceding claimed embodiment(s).

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain, by way of example, the principles of the invention.

DETAILED DESCRIPTION

The hereinafter described method can be used for reducing any suitable film roughness. However, the described method is particularly suitable for reducing, if not eliminating, film roughness in a CVD processes, for example in the field of semiconductor or IC fabrication. One form of CVD is Plasma Enhanced Chemical Vapor Deposition (PECVD). PECVD may be used as a deposit method for depositing thin films from a gas state (vapor) to a solid state on some substrate. PECVD is suitable for semiconductor or IC fabrication.

Substrate or wafer fabrication is an important part of semiconductor and IC manufacturing. The fabrication process may involve a series of operations, such as for example, oxidation, masking, etching, doping, dielectric deposition, metallization, and passivation. For example, during deposition, a film or layer of either electrically insulating (dielectric) material, electrically conductive material, or a combination thereof may be deposited or grown on a substrate, such as a silicon wafer. Such a film may, for example, be a premetal dielectric (PMD) film, which may be deposited before any metal layers in a multilevel metal structure, for example as a separating initial layer in a composite layer film. Another example of a film layer may be an intermetal dielectric (IMD) film, which is deposited between conductor lines or structures. A further example of a film layer is a passivation film, which is a final dielectric layer deposited to protect the circuit from damage and contamination. Openings can be etched in this layer to allow access to the top layer of metal by electrical probes and wire bonds.

A film may comprise one or more dangling bond. A dangling bond may occur when an atom is missing a neighbor to which it would be able to bind. Such dangling bonds are defects that disrupt the flow of electrons and that are able to collect the electrons. A dangling bond may be a broken covalent bond. Dangling bonds can be found on the surface of most crystalline materials due to the absence of lattice atoms above them. Nucleation of crystalline, amorphous, and even vacancy clusters in solid materials may be important, for example to the semiconductor industry. Dangling bonds may cause formations to a subsequent layer, because the dangling bonds may become very active nucleation sites for the subsequent layer. Such dangling bond formations may cause a film layer to become rough and not even. These dangling bond formations may grow and become larger with every subsequent layer deposited on top of the layer with the dangling bonds. This has been schematically illustrated by the FIGS. 1 and 2.

Figure 1:
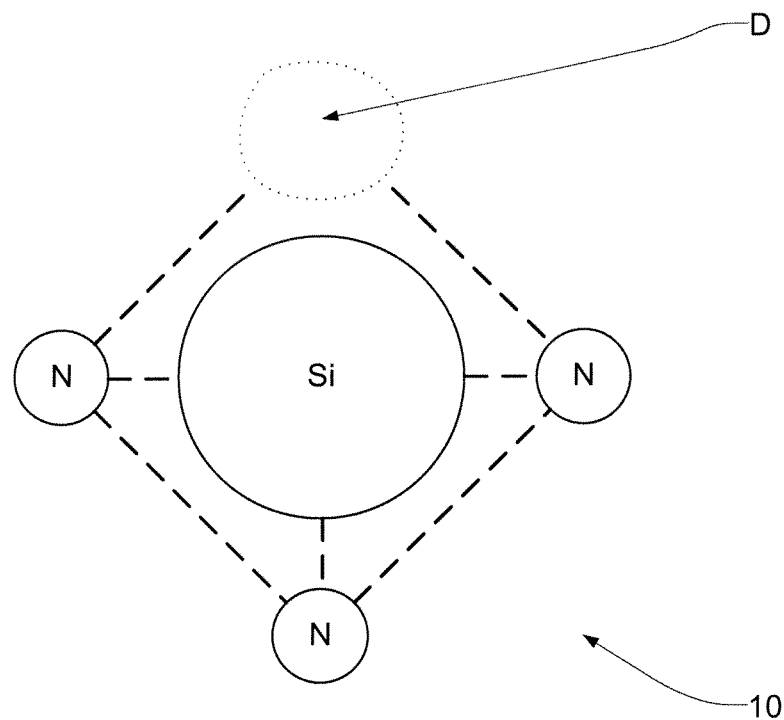
FIG. 1 illustrates an example of a nonstoichiometric $Si_3N_4$ molecule.

FIG. 1 illustrates an example of a nonstoichiometric $Si_3N_4$ molecule 10 with a missing element. The $Si_3N_4$ molecule 10 is not saturated and an area for a dangling bond is marked with the letter D. Such a dangling bond may cause formations to a subsequent layer, because the dangling bond may become a very active nucleation site for the subsequent film layer.

Figure 2:
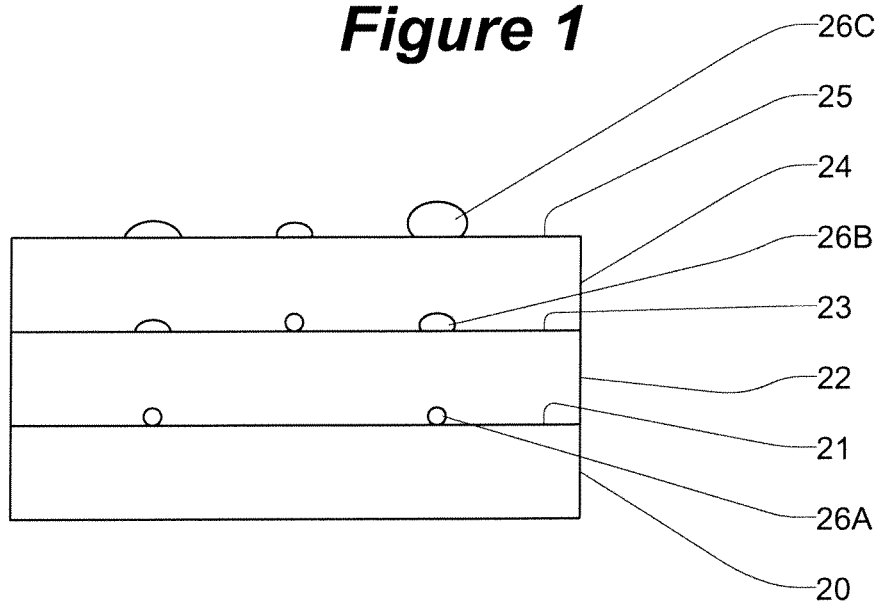
FIG. 2 illustrates an example of an embodiment of film layers.

FIG. 2 illustrates an example of an embodiment of film layers 20, 22, and 24. Layer 22 is a subsequent layer to layer 20 and has been deposited on top of layer 20. Layer 24 is a subsequent layer to layers 20 and 22 and has been deposited on top of layers 20 and 22. Any suitable method for depositing the layers may be used. These layers 20, 22, and 24 have respective film layer surfaces 21, 23, and 25.

The dangling bonds on the nonstoichiometric film surfaces 21, 23, and 25 may cause formation of surface roughness on each layer of film by nucleus growth during main CVD deposition process, for example 26A, 26B, and 26C. One example of such a island nucleus formation is marked as 26A on the film surface 21. When the next layer 22 is deposited, the island nucleus formation 26B on the next film surface 23 may have grown. When the subsequent layer 24 is deposited, the nucleus formation 26C on the subsequent film surface 25 may have grown even further. These nonstoichiometric film surfaces 21, 23, and 25 of the layers may cause rough film surfaces because of these island nucleus formation triggered by dangling bonds underneath island nuclei. Such an uneven surface, which is unpassivated or, will not be smooth and may cause inferior chip quality.

Figure 3:
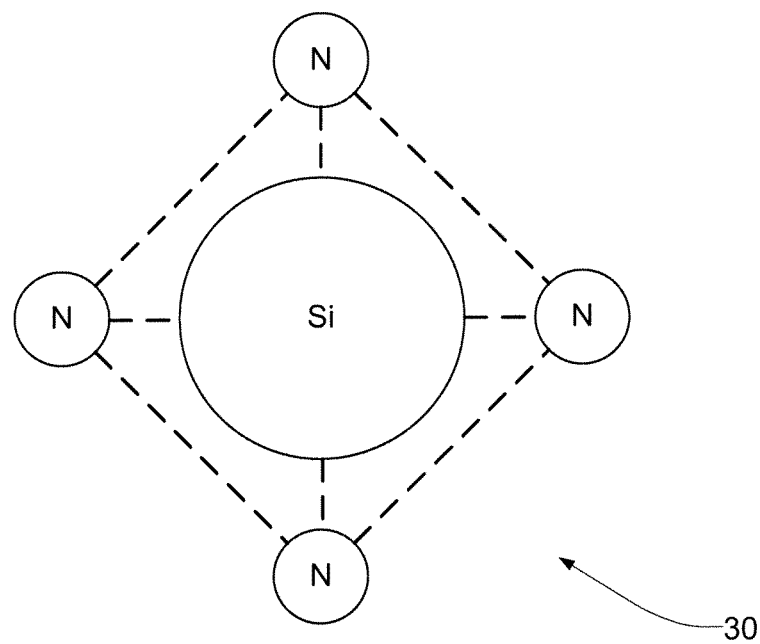
FIG. 3 illustrates an example of a stoichiometric $Si_3N_4$ molecule.
Figure 4:
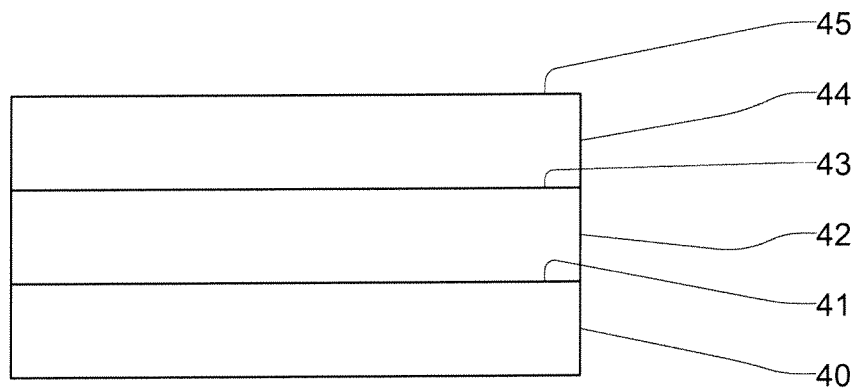
FIG. 4 illustrates an example of an embodiment of film layers.

Turning to FIGS. 3 and 4, according to at least one embodiment, the film surface roughness may be reduced, if not eliminated, in CVD of dielectric films by removing dangling bonds from a film surface of a CVD dielectric film by a reactant. When passivating a nonstoichiometric surface of a CVD dielectric film by a reactant, aggressive nucleation sites which are dangling bonds on a film surface of a precedent film layer is reduced and a subsequent film layer is prevented from becoming a rough film layer. Such a reduction enables a photolithography process to become more marginal. By the reduction of roughness can be controlled and this may render KLA defect detection much more sensitive and precise to a smaller size of defect detection limits. The elimination, or at least highly reduction of reactive nucleation sites of subsequent deposited layer may result in smooth film surfaces providing better real-estate for Front-End devices with reliable device characteristics. This has been schematically illustrated by the FIGS. 3 and 4.

FIG. 3 illustrates an example of a stoichiometric $Si_3N_4$ molecule 30. Here no dangling bond is present, because the $Si_3N_4$ molecule 30 has been passivated with an reactant element. Such thermodynamically stable stoichiometric formation of $SI_3N_4$ may result in a passivated smooth film surface.

FIG. 4 illustrates an example of an embodiment of film layers 40, 42, and 44. Layer 42 is a subsequent layer to layer 40 and has been deposited on top of layer 40. Layer 44 is a subsequent layer to layers 40 and 42 and has been deposited on top of layers 40 and 42. Any suitable method for depositing the layers may be used. These layers 40, 42, and 44 have respective film layer surfaces 41, 43, and 45. The film surfaces 41, 43, and 45 are stoichiometric film surfaces, because all, or substantially all dangling bonds have been removed. This may be done with a reactant.

Figure 5:
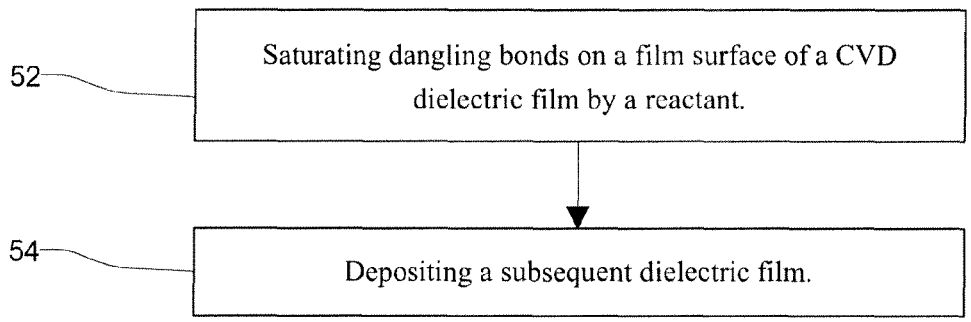
FIG. 5 illustrates a flow chart of an exemplary method of one embodiment.

FIG. 5 illustrates a flow chart of an exemplary method 50 for reducing film surface roughness in CVD of dielectric films. According to one embodiment, method 50 preferably begins at step 52. As noted below, teachings of the present disclosure may be implemented in a variety of configurations of system 70 illustrated in FIG. 7. As such, the preferred initialization point for method 50 and the order of the steps comprising method 50 may depend on the implementation chosen.

According to one embodiment, a method 50 for reducing film surface roughness in CVD of dielectric films may include removing dangling bonds from film surface of a CVD dielectric film by a reactant. At step 52 a nonstoichiometric surface of a CVD dielectric film is passivated by a reactant.

According to one embodiment, the method may additionally include depositing a subsequent dielectric film. This is illustrated by step 54. The passivation step reduces a surface roughness of a subsequent film by removing dangling bonds from the film surface of a previous dielectric film. By the removal of the dangling bonds of a previous film, a surface roughness of a subsequent film can be reduced. The passivation may terminate substantially all the dangling bonds. As a result, a method of CVD dielectric film surface passivation for film roughness control of a subsequent CVD dielectric film may be provided for.

According to one embodiment, the passivation step is done before or after a main film deposition step. For example, the passivation may be done at a previous step before main film deposition steps to remove dangling bonds on the film surface of previous film layer. By passivating the very bottom layer on which the main film is deposited, rough subsequent layers may be avoided. Alternatively, the passivation may be done at a later step after main film deposition steps to remove dangling bonds on the film surface of current dielectric film layer. According to one embodiment, the passivation step is done before and after a main film deposition step. As a result, all aggressive nucleation sites on the surface of the precedent CVD film layer is removed so that it prevents the subsequent CVD film from becoming a rough film layer.

According to one embodiment, the passivation step is done in-situ with a dielectric film deposition sequence. This allows the passivation to be done in one sequence process instead of two separate processes. Once a wafer is in a processing tool, the very first film layer may be deposited and, instead of removing the wafer from the tool, the wafer may be left inside the processing tool and the reactant gas may be turn on to perform the passivation process. Thus, a deposition process and a passivation process are done in one sequence process. Hereby the extra work of removing the wafer and put it back in again in the processing tool is saved. Further, the vacuum is not broken which may cause a better result.

According to one embodiment, the nonstoichiometric surface of a CVD dielectric film like UV light transparent Silicon Nitride (UVSIN), Silicon Rich Oxide (SRO), Silicon Dioxide ($SiO_2$), Silicon Nitride ($Si_3N_4$), Phosphosilicate Glass (PSG) or Silicon Oxynitride (SiON) is passivated by a reactant gas like Ammonia ($NH_3$), Hydrogen ($H_2$), Nitrous Oxide ($N_2O$) or Oxygen ($O_2$). The method for reducing film surface roughness in Chemical Vapor Deposition (CVD) of dielectric films may include a dielectric film including at least one out of the following group: ultraviolet light transparent Silicon Nitride (UVSIN), Silicon Rich Oxide (SRO), Silicon Dioxide ($SiO_2$), Silicon Nitride ($Si_3N_4$), Phosphosilicate Glass (PSG), or Silicon Oxynitride (SiON). The reactant gas may include at least one out of the following group: Ammonia ($NH_3$), Hydrogen ($H_2$), Nitrous Oxide ($N_2O$), or Oxygen ($O_2$).

According to one embodiment, the passivation step may be part of a process of manufacturing a chip, an integrated circuit (IC), or a semiconductor. The dielectric film may include at least one out of the following group: a premetal dielectric (PMD) film, an intermetal dielectric (IMD) film, or a passivation film.

According to one embodiment the film layer is a PECVD film layer. However, the CVD method used may be any one out of the following group: Thermal CVD (TCVD), Atmospheric pressure CVD (APCVD), Low-pressure CVD (LPCVD), Ultrahigh vacuum CVD (UHVCVD), Aerosol assisted CVD (AACVD), Direct liquid injection CVD (DLICVD), Microwave plasma-assisted CVD (MPCVD), Plasma Enhanced CVD (PECVD), Remote plasma-enhanced CVD (RPECVD), Atomic layer CVD (ALCVD), Hot wire CVD (HWCVD), Catalytic CVD (Cat-CVD), hot filament CVD (HFCVD), Metalorganic chemical vapor deposition (MOCVD), Hybrid Physical-Chemical Vapor Deposition (HPCVD), Rapid thermal CVD (RTCVD), or Vapor phase epitaxy (VPE).

Figure 6:
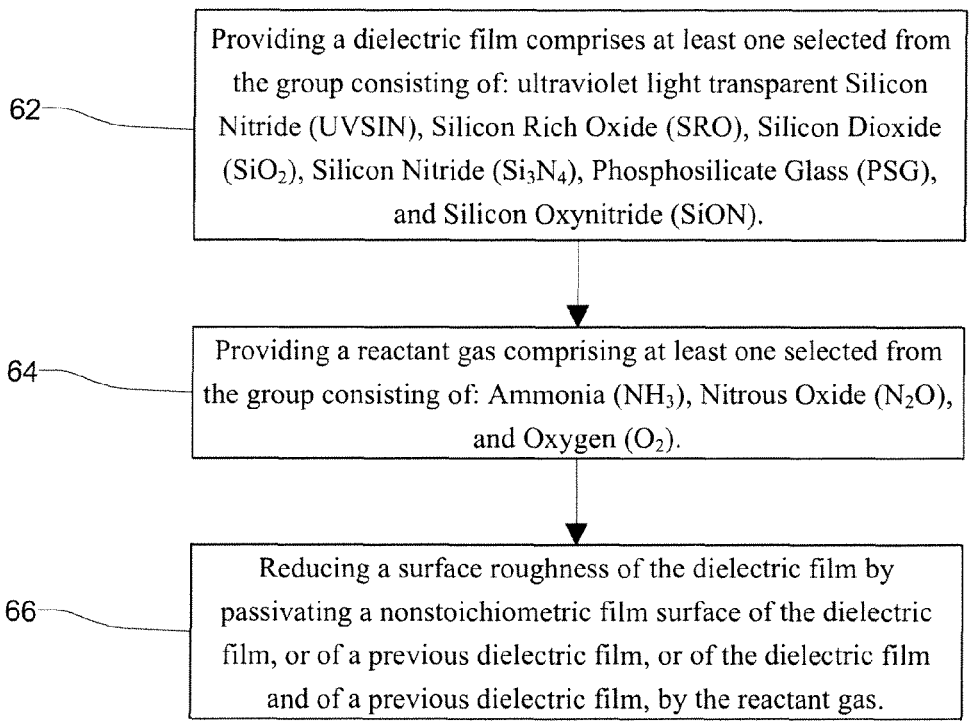
FIG. 6 illustrates a flow chart of an exemplary method of one embodiment.

According to one embodiment, a method 60 for reducing film surface roughness in CVD of dielectric films is illustrated in FIG. 6. At a step 62, method 60 includes providing a dielectric film comprises at least one selected from the group consisting of: ultraviolet light transparent Silicon Nitride (UVSIN), Silicon Rich Oxide (SRO), Silicon Dioxide ($SiO_2$), Silicon Nitride ($Si_3N_4$), Phosphosilicate Glass (PSG), and Silicon Oxynitride (SiON). At a further step 64, method 60 includes providing a reactant gas comprising at least one selected from the group consisting of: Ammonia ($NH_3$), Hydrogen ($H_2$), Nitrous Oxide ($N_2O$), and Oxygen ($O_2$). At a step 66, method 60 also includes reducing a surface roughness of the dielectric film by passivating a nonstoichiometric film surface of the dielectric film, or of a previous dielectric film, or of the dielectric film and of a previous dielectric film, by the reactant gas. These steps may be taken in any order or may be combined for reducing film surface roughness. According to one embodiment, method 60 preferably begins at step 62. As noted below, teachings of the present disclosure may be implemented in a variety of configurations of system 70 illustrated in FIG. 7. As such, the preferred initialization point for method 60 and the order of the steps comprising method 60 may depend on the implementation chosen.

Method 60 may reduce a surface roughness of a dielectric film by passivating a nonstoichiometric film surface of the dielectric film, or of a previous dielectric film, or of the dielectric film and of a previous dielectric film, by a reactant gas in the vapor environment. The dielectric film may include at least one out of the following group: ultraviolet light transparent Silicon Nitride (UVSIN), Silicon Rich Oxide (SRO), Silicon Dioxide ($SiO_2$), Silicon Nitride ($Si_3N_4$), Phosphosilicate Glass (PSG), or Silicon Oxynitride (SiON), and the reactant gas may include at least one out of the following group: Ammonia ($NH_3$), Hydrogen ($H_2$), Nitrous Oxide ($N_2O$), or Oxygen ($O_2$).

According to further embodiments, the passivation saturates dangling bonds on a film surface; the passivating step may be done before or after, or before and after, a main film deposition step; and/or the passivating step is done in-situ with a dielectric film deposition sequence.

According to one embodiment, the passivating step may be part of a process of manufacturing a chip, an integrated circuit (IC), or a semiconductor. Additionally, at least one dielectric film may include at least one out of the following group: a premetal dielectric (PMD) film, an intermetal dielectric (IMD) film, or a passivation film.

Method 50 or 60 may be implemented using system 70 or any other system operable to implement method 50 or 60. In certain embodiments, method 50 or 60 may be implemented partially in software embodied in computer-readable media.

According to one embodiment a system 70 may include means for depositing a dielectric film by CVD on a wafer and means for introducing a reactant gas in-situ with a dielectric film deposition sequence. The means for introducing a reactant gas is operable to saturate dangling bonds of a dielectric film deposited by CVD.

Figure 7:
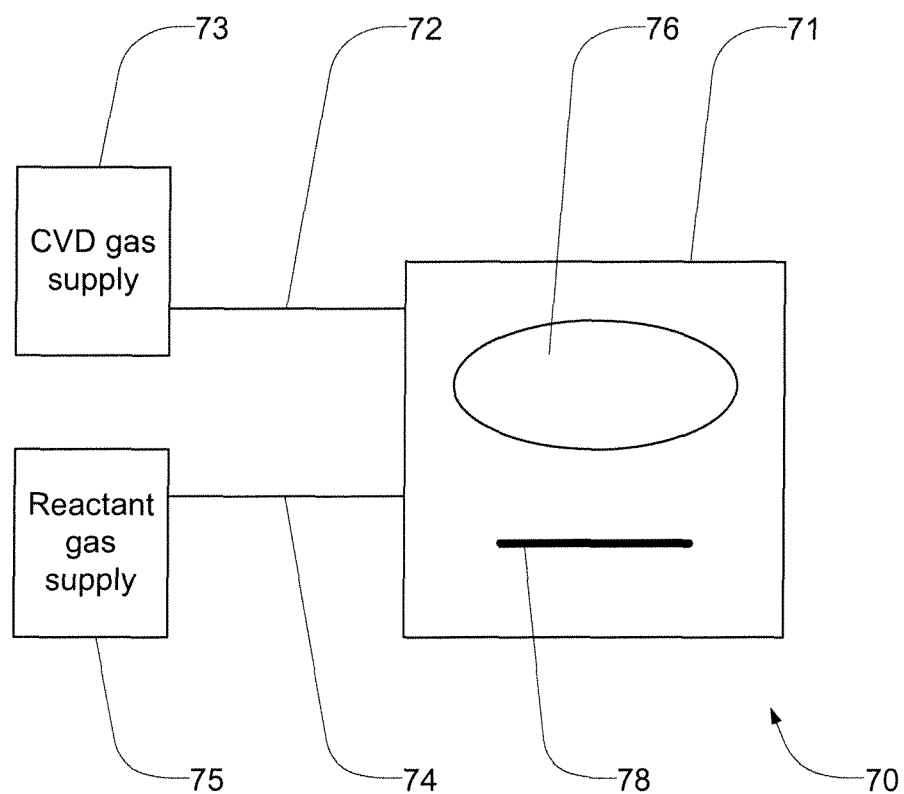
FIG. 7 illustrates an exemplary embodiment of a system.

FIG. 7 illustrates an exemplary embodiment of a system 70 for depositing a dielectric film by CVD and introducing a reactant gas. A wafer 78 is positioned in a processing tool in a CVD machine 71. The chemical vapor of the CVD process is illustrated by the oval 76. The gas for the CVD is supplied from a supply 73 to the CVD machine 71 by a conduit 72. In addition hereto, the system 70 may include a supply 75 for a reactant gas used for removing dangling bonds. The reactant gas may be supplied to the CVD machine 71 through a conduit 74. The conduit 74 may be combined with conduit 72.

The system 70 allows for the passivation step to be made in-situ with a dielectric film deposition sequence. This allows the saturation to be done in one sequence process instead of two separate processes. Once the wafer 78 is in the processing tool of the CVD machine 71, a film layer (for example the main film) may be deposited and, instead of removing the wafer 78 from the tool, the wafer 78 may be left inside the CVD machine 71 and the reactant gas may then be turn on to perform the passivation process. Thus, the system 70 allows a deposition process and a passivation process to be made in one sequence process. Hereby the extra work of removing the wafer 78 and put it back in again in the processing tool in the CVD machine 71 is saved. Further, the vacuum in the CVD machine 71 is not broken which may cause a better result.

According to one embodiment, the means for depositing may be operable to deposit a dielectric film comprises at least one out of the following group: ultraviolet light transparent Silicon Nitride (UVSIN), Silicon Rich Oxide (SRO), Silicon Dioxide ($SiO_2$), Silicon Nitride ($Si_3N_4$), Phosphosilicate Glass (PSG), or Silicon Oxynitride (SiON). The means for introducing a reactant gas may be operable to introduce a reactant gas comprises at least one out of the following group: Ammonia ($NH_3$), Hydrogen ($H_2$), Nitrous Oxide ($N_2O$), or Oxygen ($O_2$).

The system may implement any CVD method. Preferably, the means for depositing may be operable to deposit a dielectric film by one out of the following group of CVD methods: Thermal CVD (TCVD), Atmospheric pressure CVD (APCVD), Low-pressure CVD (LPCVD), Ultrahigh vacuum CVD (UHVCVD), Aerosol assisted CVD (AACVD), Direct liquid injection CVD (DLICVD), Microwave plasma-assisted CVD (MPCVD), Plasma Enhanced CVD (PECVD), Remote plasma-enhanced CVD (RPECVD), Atomic layer CVD (ALCVD), Hot wire CVD (HWCVD), Catalytic CVD (Cat-CVD), hot filament CVD (HFCVD), Metalorganic chemical vapor deposition (MOCVD), Hybrid Physical-Chemical Vapor Deposition (HPCVD), Rapid thermal CVD (RTCVD), or Vapor phase epitaxy (VPE).

Figure 8:
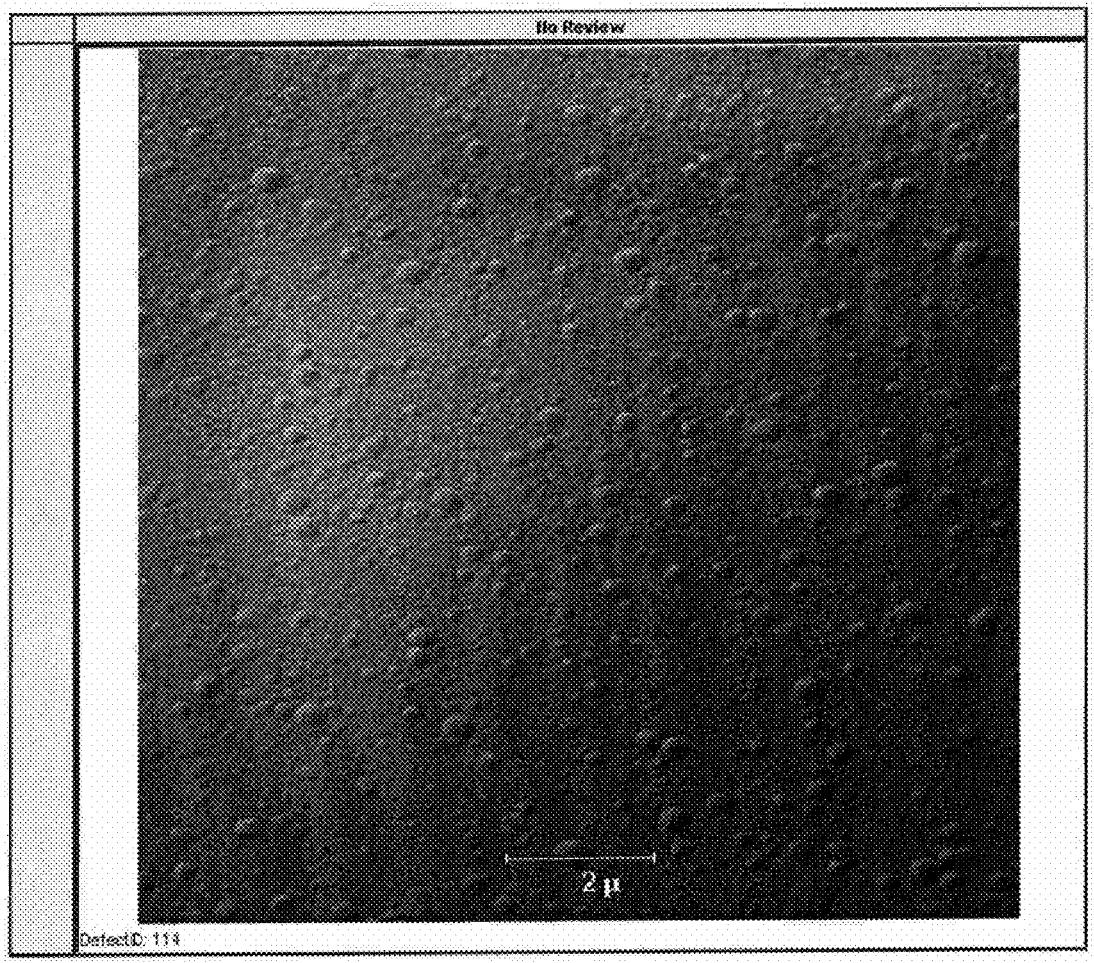
FIG. 8 illustrates a rough film surface of an exemplary film layer with dangling bond formations.
Figure 9:
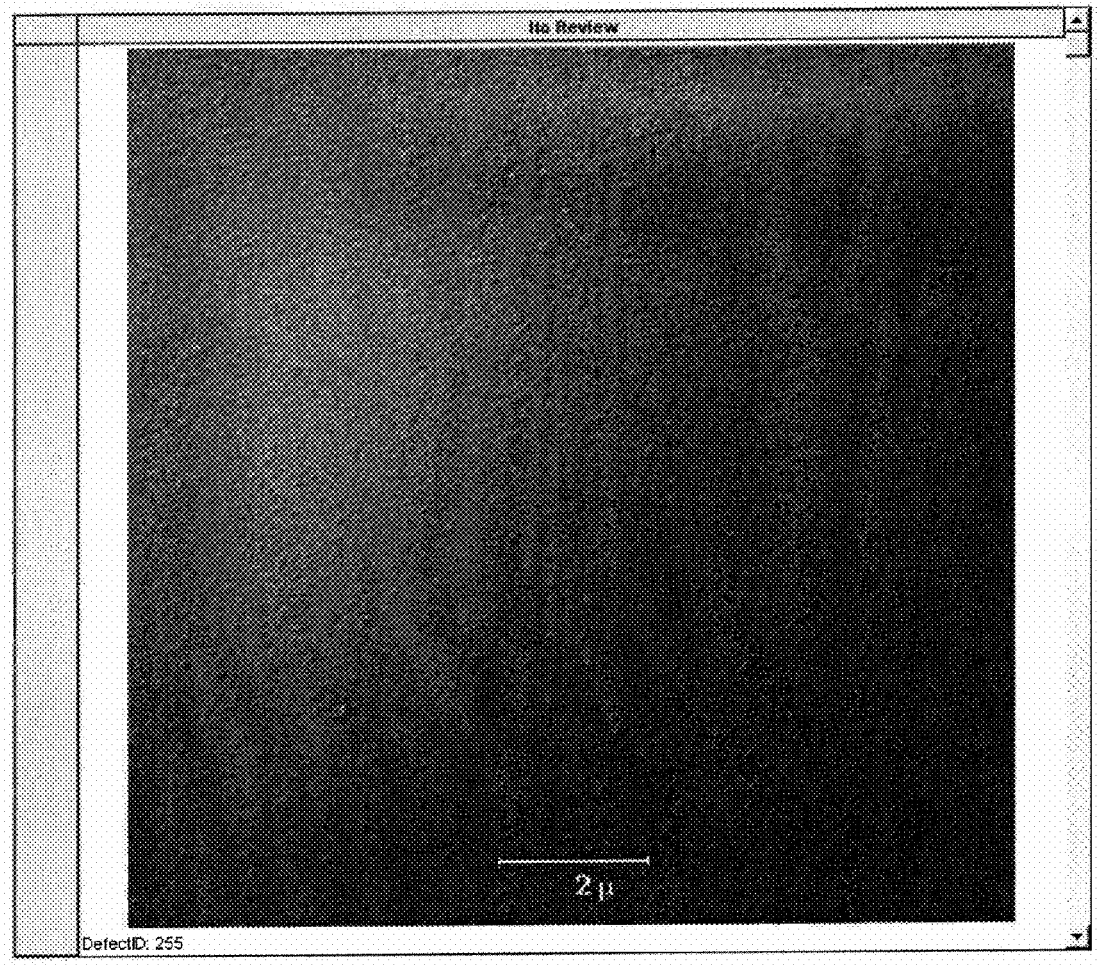
FIG. 9 illustrates a smooth film surface of an exemplary film layer according to at least one embodiment of the disclosed method.

FIG. 8 illustrates a rough film surface of an exemplary film layer with rough film surface formation caused by island nucleus growth. Here the film layers have not been deposited according to an embodiment of the disclosure. FIG. 9 illustrates a smooth film surface of an exemplary film layer according to at least one embodiment of the disclosed method. The difference in film surface roughness may be taken from comparing FIGS. 8 and 9. For example, the smooth film surface of FIG. 9 may be achieved as part of an in-situ film deposition sequence, turning off a reactive Si precursor gas (for example TEOS, or $SiH_4$) with saturation of other reactant gas (for example $NH_3$, $N_2O$, or $O_2$) in the vapor environment at a previous passivation step before main film deposition steps or at a later passivation step after main film deposition steps. Such passivation of a nonstoichiometric film surface may enable formation of a smooth film surface on the following film layers by removing dangling bonds from the surface of previous dielectric film layers.

The system and method discussed above reduces film surface roughness in CVD of dielectric films, for example when manufacturing a chip, an integrated circuit (IC), or a semiconductor. The invention, therefore, is well adapted to carry out the objects and attain the ends and advantages mentioned, as well as others inherent therein. While the invention has been described and is defined by reference to particular preferred embodiments of the invention, such references do not imply a limitation on the invention, and no such limitation is to be inferred. The invention is capable of considerable modification, alteration, and equivalents in form and function, as will occur to those ordinarily skilled in the pertinent arts. The described preferred embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. A method for reducing film surface roughness in Chemical Vapor Deposition (CVD) of dielectric films, comprising the step in the following order:
   providing a substrate;
   performing a CVD of a first dielectric film;
   removing dangling bonds on a film surface of the first CVD dielectric film by passivating a nonstochiometric film surface of the first dielectric film with a first reactant gas;
   performing at least one subsequent CVD of a second dielectric film directly on top of said first dielectric film;
   removing dangling bonds on a film surface of the second CVD dielectric film by passivating a film surface of the second dielectric film with a second reactant gas, wherein each step of passivating for each dielectric layer reduces a surface roughness of a subsequent film by removing dangling bonds from the film surface of a previous dielectric film.

2. The method according to claim 1, wherein the first and second reactant gas comprise at least one of, selected from the group consisting of: Ammonia ($NH_3$), Hydrogen ($H_2$), and Oxygen ($O_2$).

3. The method according to claim 1, further comprising removing dangling bonds on a previous deposited film surface of the substrate before said first CVD.

4. The method according to claim 1, wherein each step of passivating is performed in-situ with a dielectric film deposition sequence.

5. The method according to claim 1, wherein the first and/or second dielectric film comprises at least one selected from the group consisting of: ultraviolet light transparent Silicon Nitride (UVSIN), Silicon Rich Oxide (SRO), Silicon Dioxide ($SiO_2$), Silicon Nitride ($Si_3N_4$), Phosphosilicate Glass (PSG), and Silicon Oxynitride (SiON).

6. The method according to claim 1, wherein the first and second reactant gas comprises at least one selected from the group consisting of: Ammonia ($NH_3$), Hydrogen ($H_2$), Nitrous Oxide ($N_2O$), and Oxygen ($O_2$).

7. The method according to claim 1, wherein each step of passivating is part of manufacturing a chip, an integrated circuit (IC), or a semiconductor.

8. The method according to claim 1, wherein the first and/or the second dielectric film is selected from the group consisting of: a premetal dielectric (PMD) film, an intermetal dielectric (IMD) film, and a passivation film.

9. The method according to claim 1, wherein the CVD method is selected from the group consisting of: Thermal CVD (TCVD), Atmospheric pressure CVD (APCVD), Low-pressure CVD (LPCVD), Ultrahigh vacuum CVD (UHVCVD), Aerosol assisted CVD (AACVD), Direct liquid injection CVD (DLICVD), Microwave plasma-assisted CVD (MPCVD), Plasma Enhanced CVD (PECVD), Remote plasma-enhanced CVD (RPECVD), Atomic layer CVD (ALCVD), Hot wire CVD (HWCVD), Catalytic CVD (Cat-CVD), hot filament CVD (HFCVD), Metalorganic chemical vapor deposition (MOCVD), Hybrid Physical-Chemical Vapor Deposition (HPCVD), Rapid thermal CVD (RTCVD), and Vapor phase epitaxy (VPE).

10. A method for reducing film surface roughness in Chemical Vapor Deposition (CVD) of dielectric films, comprising the steps of:

providing a substrate;

depositing a first dielectric film on said substrate during manufacture comprising at least one of, selected from the group consisting of: ultraviolet light transparent Silicon Nitride (UVSIN), Silicon Rich Oxide (SRO), Silicon Dioxide ($SiO_2$), Silicon Nitride ($Si_3N_4$), Phosphosilicate Glass (PSG), and Silicon Oxynitride (SiON);

reducing a surface roughness of the first dielectric film by passivating a nonstoichiometric film surface of the dielectric film with reactant gas comprising at least one of, selected from the group consisting of: Ammonia ($NH_3$), Hydrogen ($H_2$), Nitrous Oxide ($N_2O$), and Oxygen ($O_2$);

performing at least one subsequent CVD of a second dielectric film on top of said first dielectric film;

passivating a film surface of the second CVD dielectric film by exposing the second dielectric film to reactant gas comprising at least one of, selected from the group consisting of: Ammonia ($NH_3$), Hydrogen ($H_2$), Nitrous Oxide ($N_2O$), and Oxygen ($O_2$).

11. The method according to claim 10, wherein the passivation removes dangling bonds on a film surface.

12. The method according to claim 10, wherein the passivating step is done before or after, or before and after, a main film deposition step.

13. The method according to claim 10, wherein the passivating step is done in-situ with a dielectric film deposition sequence.

14. The method according to claim 10, wherein at least one of the first and/or the second dielectric film is selected from the group consisting of: a premetal dielectric (PMD) film, an intermetal dielectric (IMD) film, and a passivation film.

15. The method according to claim 10, wherein the passivating step is part of manufacturing a chip, an integrated circuit (IC), or a semiconductor.

* * * * *